United States Patent
Oya et al.

(10) Patent No.: US 8,334,199 B2
(45) Date of Patent: Dec. 18, 2012

(54) METHOD FOR FABRICATING NITRIDE-BASED SEMICONDUCTOR DEVICE HAVING ELECTRODE ON M-PLANE

(75) Inventors: Mitsuaki Oya, Aichi (JP); Toshiya Yokogawa, Nara (JP); Atsushi Yamada, Osaka (JP); Akihiro Isozaki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/937,758

(22) PCT Filed: Mar. 17, 2010

(86) PCT No.: PCT/JP2010/001921
§ 371 (c)(1),
(2), (4) Date: Oct. 14, 2010

(87) PCT Pub. No.: WO2010/113406
PCT Pub. Date: Oct. 7, 2010

(65) Prior Publication Data
US 2011/0037089 A1 Feb. 17, 2011

(30) Foreign Application Priority Data

Apr. 3, 2009 (JP) ................................. 2009-091514
Dec. 25, 2009 (JP) ..................... PCT/JP2009/007284

(51) Int. Cl.
*H01L 21/3205* (2006.01)
(52) U.S. Cl. ............ 438/605; 438/46; 438/47; 438/597; 438/604; 438/652; 438/656; 438/658; 438/660; 438/661; 438/666; 257/79; 257/94; 257/99; 257/100; 257/103; 257/E33.025; 257/E33.028; 257/E33.03; 257/E33.033; 257/E33.034; 257/E33.062; 257/E33.063

(58) Field of Classification Search .................... 438/46, 438/47, 604, 605, 652, 656, 658, 660, 661, 438/666, 597; 257/79, 94, 99, 100, 103, 257/E33.025, E33.028, E33.03, E33.033, 257/E33.034, E33.062, E33.063
See application file for complete search history.

(56) References Cited

U.S. PATENT DOCUMENTS 7,285,857 B2 * 10/2007 Kwak et al. .................... 257/745
7,491,979 B2 *  2/2009 Kwak et al. .................... 257/98
(Continued)

FOREIGN PATENT DOCUMENTS
JP         2001-308462         11/2001
(Continued)

OTHER PUBLICATIONS

International Search Report for related International Application No. PCT/JP2011/001764 mailed May 17, 2011.

(Continued)

*Primary Examiner* — Jay C Kim
(74) *Attorney, Agent, or Firm* — Renner, Otto, Boisselle & Sklar, LLP

(57) ABSTRACT

A nitride-based semiconductor light-emitting device 100 includes: a GaN substrate 10 with an m-plane surface 12; a semiconductor multilayer structure 20 provided on the m-plane surface 12 of the GaN substrate 10; and an electrode 30 provided on the semiconductor multilayer structure 20. The electrode 30 includes a Zn layer 32 and an Ag layer 34 provided on the Zn layer 32. The Zn layer 32 is in contact with a surface of a p-type semiconductor region of the semiconductor multilayer structure 20.

9 Claims, 11 Drawing Sheets

U.S. PATENT DOCUMENTS

| | | | |
|---|---|---|---|
| 7,541,207 B2* | 6/2009 | Song et al. | 438/29 |
| 7,960,746 B2* | 6/2011 | Kwak et al. | 257/98 |
| 8,093,618 B2* | 1/2012 | Lee et al. | 257/99 |
| 2002/0014630 A1 | 2/2002 | Okazaki et al. | |
| 2004/0026702 A1 | 2/2004 | Yamada et al. | |
| 2007/0145391 A1 | 6/2007 | Baik et al. | |
| 2008/0093617 A1 | 4/2008 | Song et al. | |
| 2008/0164489 A1 | 7/2008 | Schmidt et al. | |
| 2008/0251781 A1 | 10/2008 | Han et al. | |
| 2009/0065763 A1 | 3/2009 | Kamiyama et al. | |
| 2009/0101936 A1 | 4/2009 | Kamei et al. | |
| 2009/0134418 A1* | 5/2009 | Lee | 257/98 |
| 2010/0032644 A1 | 2/2010 | Akita et al. | |

FOREIGN PATENT DOCUMENTS

| | | |
|---|---|---|
| JP | 2002-026392 | 1/2002 |
| JP | 2003-332697 | 11/2003 |
| JP | 2006-024750 | 1/2006 |
| JP | 3821128 | 6/2006 |
| JP | 2007-109915 | 4/2007 |
| JP | 2007-180504 | 7/2007 |
| JP | 2008-103674 | 5/2008 |
| JP | 2008-140841 | 6/2008 |
| JP | 2008-153285 | 7/2008 |
| JP | 2008-227323 | 9/2008 |
| JP | 2008-258503 A | 10/2008 |
| WO | 2007/136097 A1 | 11/2007 |

OTHER PUBLICATIONS

Form PCT-ISA-237 for related International Application No. PCT/JP2011/001764 mailed May 17, 2011.

Office Action for related U.S. Appl. No. 13/167,064 mailed Jan. 23, 2012.

International Search Report for corresponding International Application No. PCT/JP2010/001921 mailed Apr. 27, 2010.

Form PCT-ISA-237 for corresponding International Application No. PCT/JP2010/001921 mailed Apr. 27, 2010.

Office Action for corresponding Chinese patent application No. 201080001394.2 issued on Aug. 24, 2012, and partial English translation.

* cited by examiner

○ N
▨ Ga c-PLANE (0001)
m-PLANE (10-10)
[0001]
c-AXIS DIRECTION (a)

| | m-PLANE GaN (Pd/Pt) | m-PLANE GaN (Zn/Ag) |
|---|---|---|
| as-depo | | |
| 400°C | ✗ | |
| 500°C | | ✗ |
| 600°C | | |
| 700°C | | |

(a)

(b)

METHOD FOR FABRICATING NITRIDE-BASED SEMICONDUCTOR DEVICE HAVING ELECTRODE ON M-PLANE

TECHNICAL FIELD

The present invention relates to a nitride-based semiconductor device and a method for fabricating such a device. More particularly, the present invention relates to a GaN-based semiconductor light-emitting device such as a light-emitting diode or a laser diode that operates at wavelengths over the ultraviolet range and the entire visible radiation range, which covers blue, green, orange and white parts of the spectrum. Such a light-emitting device is expected to be applied to various fields of technologies including display, illumination and optical information processing in the near future. The present invention also relates to a method of making an electrode for use in such a nitride-based semiconductor device.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $0 \leq x, y, z \leq 1$ and $x+y+z=1$)) have been researched and developed particularly extensively. As a result, blue light-emitting diodes (LEDs), green LEDs, and semiconductor laser diodes made of GaN-based semiconductors have already been used in actual products.

A GaN-based semiconductor has a wurtzite crystal structure. FIG. 1 schematically illustrates a unit cell of GaN. In an $Al_xGa_yIn_zN$ (where $0 \leq x, y, z \leq 1$ and $x+y+z=1$) semiconductor crystal, some of the Ga atoms shown in FIG. 1 may be replaced with Al and/or In atoms.

FIG. 2 shows four fundamental vectors $a_1$, $a_2$, $a_3$ and c, which are generally used to represent planes of a wurtzite crystal structure with four indices (i.e., hexagonal indices). The fundamental vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a c-plane substrate, i.e., a substrate of which the principal surface is a (0001) plane, is used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer. Consequently, due to the quantum confinement Stark effect of carriers, the internal quantum yield decreases, thus increasing the threshold current in a semiconductor laser diode and increasing the power dissipation and decreasing the luminous efficacy in an LED. Meanwhile, as the density of injected carriers increases, the piezoelectric field is screened, thus varying the emission wavelength, too.

Thus, to overcome these problems, it has been proposed that a substrate of which the principal surface is a non-polar plane such as a (10-10) plane that is perpendicular to the [10-10] direction and that is called an "m-plane" (m-plane GaN-based substrate) be used. As used herein, "-" attached on the left-hand side of a Miller-Bravais index in the parentheses means a "bar" (a negative direction index). As shown in FIG. 2, the m-plane is parallel to the c-axis (i.e., the fundamental vector c) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above. The "m-plane" is a generic term that collectively refers to a family of planes including (10-10), (−1010), (1-100), (−1100), (01-10) and (0-110) planes.

Also, as used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". A layer of semiconductor crystals that have been formed as a result of the X-plane growth will be sometimes referred to herein as an "X-plane semiconductor layer".

CITATION LIST

Patent Literature

Patent Document 1: Japanese Laid-Open Patent Publication No. 2006-24750
Patent Document 2: Japanese Patent No. 3821128

SUMMARY OF INVENTION

Technical Problems

As described above, a GaN-based semiconductor device that has been grown on an m-plane substrate would achieve far more beneficial effects than what has been grown on a c-plane substrate but still has the following drawback. Specifically, a GaN-based semiconductor device that has been grown on an m-plane substrate has higher contact resistance of the p-electrode than what has been grown on a c-plane substrate, which constitutes a serious technical obstacle to using such a GaN-based semiconductor device that has been grown on an m-plane substrate.

Further, especially in an electrode of a light-emitting device, it is required to reduce the light absorption loss in an electrode section for the purpose of improving the external quantum yield, as well as to reduce the contact resistance. A metal of a large work function which has been commonly used for the p-electrode of a GaN-based semiconductor light-emitting device (Pd, Au, Pt, etc.) causes very large light absorption. Therefore, when such a metal is used for the electrode, it is impossible to achieve a high external quantum yield. Note that "external quantum yield" refers to the ratio of the number of photons radiated out of the light-emitting device to the number of carriers injected into the light-emitting device.

Under the circumstances such as these, the present inventor wholeheartedly carried out extensive research to simultaneously overcome a problem that a GaN-based semiconductor device, grown on an m-plane as a non-polar plane, would have high contact resistance, and a problem that the light absorption loss in the electrode section is high. As a result, the inventor found an effective means for reducing the contact resistance and achieving a high external quantum yield.

The present invention was conceived in view of the above. One of the major objects of the present invention is to provide a structure and manufacturing method of a p-electrode, which are capable of reducing the contact resistance of a GaN-based semiconductor device that has been fabricated by producing a crystal growth on an m-plane substrate, and which are also capable of reducing the light absorption loss in the electrode section to achieve a high external quantum yield.

Solution to Problem

The first nitride-based semiconductor device of the present invention includes: a nitride-based semiconductor multilayer structure including a p-type semiconductor region, a surface of the p-type semiconductor region being an m-plane; and an electrode that is formed on the surface of the p-type semiconductor region, wherein the p-type semiconductor region is made of an $Al_xIn_yGa_zN$ semiconductor (where $x+y+z=1$, $x \geq 0$, $y \geq 0$, and $z \geq 0$), and the electrode includes a Zn layer which is in contact with the surface of the p-type semiconductor region and an Ag layer which is provided on the Zn layer.

In one embodiment, the Ag layer is covered with a protector electrode which is made of a metal different from Ag.

In one embodiment, the Ag layer is covered with a protector layer which is made of a dielectric.

In one embodiment, the semiconductor multilayer structure includes an active layer which includes an $Al_aIn_bGa_cN$ layer (where $a+b+c=1$, $a \geq 0$, $b \geq 0$ and $c \geq 0$), the active layer being configured to emit light.

In one embodiment, the p-type semiconductor region is a p-type contact layer.

In one embodiment, a thickness of the Zn layer is equal to or smaller than a thickness of the Ag layer.

In one embodiment, the nitride-based semiconductor device further includes a semiconductor substrate that supports the semiconductor multilayer structure.

In one embodiment, in the Zn layer, a concentration of N is lower than a concentration of Ga.

In one embodiment, the p-type semiconductor region is made of GaN.

In one embodiment, the Zn layer and the Ag layer are at least partially made of an alloy.

A light source of the present invention includes: a nitride-based semiconductor light-emitting device; and a wavelength converter including a phosphor that converts a wavelength of light emitted from the nitride-based semiconductor light-emitting device, wherein the nitride-based semiconductor light-emitting device includes a nitride-based semiconductor multilayer structure including a p-type semiconductor region, a surface of the p-type semiconductor region being an m-plane, and an electrode that is formed on the surface of the p-type semiconductor region, the p-type semiconductor region is made of an $Al_xIn_yGa_zN$ semiconductor (where $x+y+z=1$, $x \geq 0$, $y \geq 0$, and $z \geq 0$), and the electrode includes a Zn layer which is in contact with the surface of the p-type semiconductor region and an Ag layer which is provided on the Zn layer.

In one embodiment, the p-type semiconductor region is made of GaN.

In one embodiment, the Zn layer and the Ag layer are at least partially made of an alloy.

A nitride-based semiconductor device fabrication method of the present invention includes the steps of: (a) providing a substrate; (b) forming on the substrate a nitride-based semiconductor multilayer structure including a p-type semiconductor region, a surface of the p-type semiconductor region being an m-plane; and (c) forming an electrode on the surface of the p-type semiconductor region of the semiconductor multilayer structure, wherein step (c) includes forming a Zn layer on the surface of the p-type semiconductor region, and forming an Ag layer on the Zn layer.

In one embodiment, step (c) further includes performing a heat treatment on the Zn layer.

In one embodiment, the heat treatment is performed at a temperature of 400° C. to 700° C.

In one embodiment, the heat treatment is performed at a temperature of 500° C. to 600° C.

In one embodiment, the method further includes removing the substrate after step (b).

In one embodiment, the p-type semiconductor region is made of GaN.

In one embodiment, in the Zn layer, a concentration of N is lower than a concentration of Ga.

In one embodiment, the Zn layer and the Ag layer are at least partially alloyed.

The second nitride-based semiconductor device of the present invention includes: a nitride-based semiconductor multilayer structure including a p-type semiconductor region, a surface of the p-type semiconductor region being an m-plane; and an electrode that is arranged on the p-type semiconductor region, wherein the p-type semiconductor region is made of an $Al_xIn_yGa_zN$ semiconductor (where $x+y+z=1$, $x \geq 0$, $y \geq 0$, and $z \geq 0$), and the electrode includes a Zn island provided on the surface of the p-type semiconductor region and an Ag layer provided on the Zn island.

The third nitride-based semiconductor device of the present invention includes: a nitride-based semiconductor multilayer structure including a p-type semiconductor region, a surface of the p-type semiconductor region being an m-plane; and an electrode that is formed on the surface of the p-type semiconductor region, wherein the p-type semiconductor region is made of an $Al_xIn_yGa_zN$ semiconductor (where $x+y+z=1$, $x \geq 0$, $y \geq 0$, and $z \geq 0$), and the electrode includes a Zn layer which is in contact with the surface of the p-type semiconductor region and an Ag layer which is provided on the Zn layer, and the Zn layer is made of a Zn—Ag alloy.

The fourth nitride-based semiconductor device of the present invention includes: a nitride-based semiconductor multilayer structure including a p-type semiconductor region, a surface of the p-type semiconductor region being an m-plane; and an electrode that is arranged on the p-type semiconductor region, wherein the p-type semiconductor region is made of an $Al_xIn_yGa_zN$ semiconductor (where $x+y+z=1$, $x \geq 0$, $y \geq 0$, and $z \geq 0$), the electrode is composed only of an alloy layer which is in contact with the surface of the p-type semiconductor region, and the alloy layer is made of Zn and Ag.

In one embodiment, the alloy layer is formed by forming a Zn layer so as to be in contact with the surface of the p-type semiconductor region and an Ag layer on the Zn layer, and thereafter performing a heat treatment.

In one embodiment, the alloy layer is formed by depositing a mixture or compound of Zn and Ag onto the surface of the p-type semiconductor region by means of evaporation, and thereafter performing a heat treatment.

Advantageous Effects of Invention

In a nitride-based semiconductor light-emitting device according to the present invention, an electrode on a semiconductor multilayer structure includes a Zn layer that is in contact with the surface (which is an m-plane) of a p-type semiconductor region. As a result, the contact resistance can be reduced. Further, an Ag layer is provided on the Zn layer to reflect light so that a high external quantum yield of light can be achieve.

BRIEF DESCRIPTION OF DRAWINGS

FIG. 6 shows the photographs of the surfaces of electrodes after the heat treatments at different temperatures, which are presented as substitutes for drawings.

DESCRIPTION OF EMBODIMENTS

Figure 1:
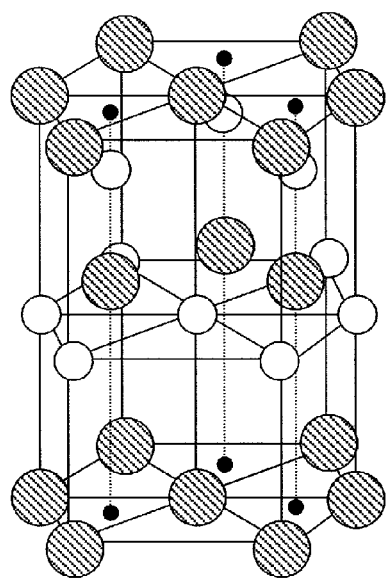
FIG. 1 is a perspective view schematically illustrating a unit cell of GaN.
Figure 1:
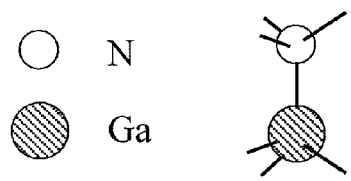
Figure 2:
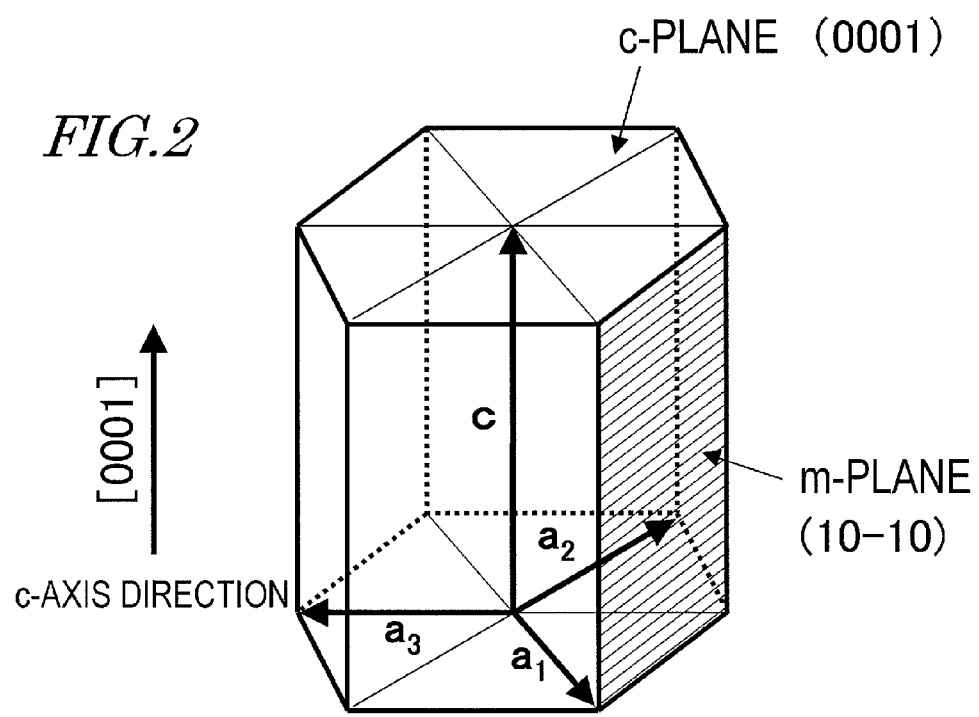
FIG. 2 is a perspective view showing four fundamental vectors $a_1$, $a_2$, $a_3$ and c representing a wurtzite crystal structure.

Hereinafter, preferred embodiments of the present invention will be described with reference to the accompanying drawings. In the drawings, any elements shown in multiple drawings and having substantially the same function will be identified by the same reference numeral for the sake of simplicity. It should be noted, however, that the present invention is in no way limited to the specific preferred embodiments to be described below.

Figure 3:
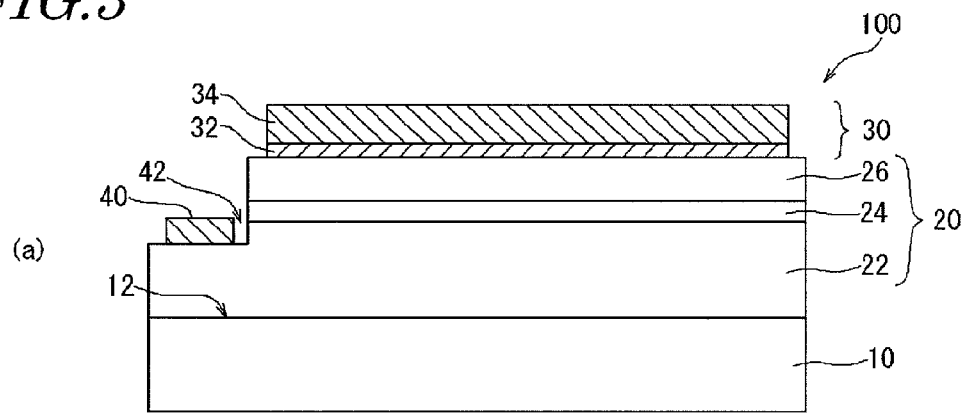
FIG. 3(a) is a schematic cross-sectional view illustrating a nitride-based semiconductor light-emitting device 100 as a preferred embodiment of the present invention.
FIGS. 3(b) and 3(c) illustrate the crystal structures of an m-plane and a c-plane, respectively.
Figure 3:
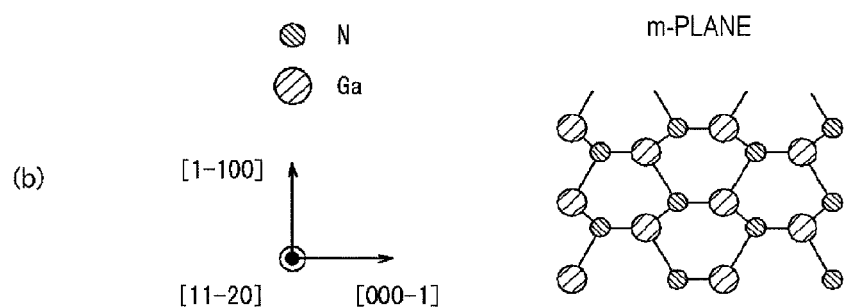
Figure 3:
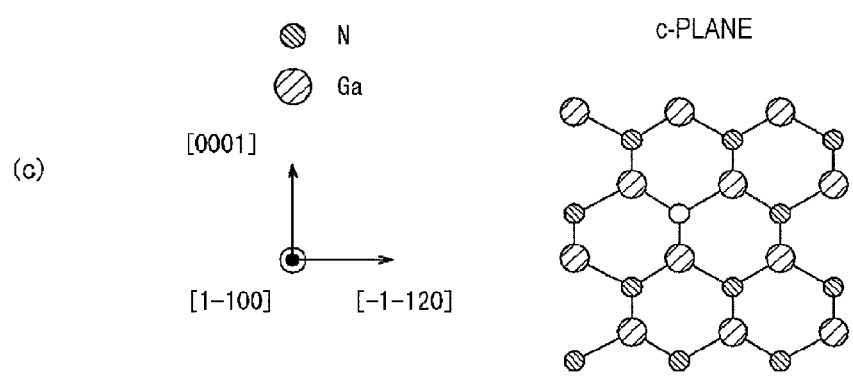

FIG. 3(a) schematically illustrates the cross-sectional structure of a nitride-based semiconductor light-emitting device 100 as a preferred embodiment of the present invention. What is illustrated in FIG. 3(a) is a semiconductor device made of GaN semiconductors and has a nitride-based semiconductor multilayer structure.

The nitride-based semiconductor light-emitting device 100 of this preferred embodiment includes a GaN-based substrate 10, of which the principal surface 12 is an m-plane, a semiconductor multilayer structure 20 that has been formed on the GaN-based substrate 10, and an electrode 30 arranged on the semiconductor multilayer structure 20. In this preferred embodiment, the semiconductor multilayer structure 20 is an m-plane semiconductor multilayer structure that has been formed through an m-plane crystal growth and its principal surface is an m-plane. It should be noted, however, that a-plane GaN could grow on an r-plane sapphire substrate in some instances. That is why according to the growth conditions, the principal surface of the GaN-based substrate 10 does not always have to be an m-plane. In the semiconductor multilayer structure 20 of the present invention, at least the surface of its semiconductor region that is in contact with an electrode needs to be an m-plane.

The nitride-based semiconductor light-emitting device 100 of this preferred embodiment includes the GaN-based substrate 10 to support the semiconductor multilayer structure 20. However, the device 100 may have any other substrate instead of the GaN-based substrate 10 and could also be used without the substrate.

FIG. 3(b) schematically illustrates the crystal structure of a nitride-based semiconductor, of which the principal surface is an m-plane, as viewed on a cross section thereof that intersects with the principal surface of the substrate at right angles. Since Ga atoms and nitrogen atoms are present on the same atomic-plane that is parallel to the m-plane, no electrical polarization will be produced perpendicularly to the m-plane. That is to say, the m-plane is a non-polar plane and no piezoelecrtric field will be produced in an active layer that grows perpendicularly to the m-plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m-plane.

Such a GaN-based substrate, of which the principal surface is an m-plane, will be referred to herein as an "m-plane GaN-based substrate". To obtain a nitride-based semiconductor multilayer structure that has grown perpendicularly to the m-plane, typically such an m-plane GaN substrate may be used and semiconductors may be grown on the m-plane of that substrate. However, the principal surface of the substrate does not have to be an m-plane as described above, and the device as a final product could already have its substrate removed.

The crystal structure of a nitride-based semiconductor, of which the principal surface is a c-plane, as viewed on a cross section thereof that intersects with the principal surface of the substrate at right angles is illustrated schematically in FIG. 3(c) just for a reference. In this case, Ga atoms and nitrogen atoms are not present on the same atomic-plane, and therefore, electrical polarization will be produced perpendicularly to the c-plane. Such a GaN-based substrate, of which the principal surface is a c-plane, will be referred to herein as a "c-plane GaN-based substrate".

A c-plane GaN-based substrate is generally used to grow GaN-based semiconductor crystals thereon. In such a substrate, a Ga (or In) atom layer and a nitrogen atom layer that extend parallel to the c-plane are slightly misaligned from each other in the c-axis direction, and therefore, electrical polarization will be produced in the c-axis direction.

Referring to FIG. 3(a) again, on the principal surface (that is an m-plane) 12 of the m-plane GaN-based substrate 10, the semiconductor multilayer structure 20 is formed. The semiconductor multilayer structure 20 includes an active layer 24 including an $Al_aIn_bGa_cN$ layer (where a+b+c=1, a≧0, b≧0 and c≧0), and an $Al_dGa_eN$ layer (where d+e=1, d≧0 and e≧0) 26, which is located on the other side of the active layer 24 opposite to the m-plane 12. In this embodiment, the active layer 24 is an electron injection region of the nitride-based semiconductor light-emitting device 100.

The semiconductor multilayer structure 20 of this preferred embodiment has other layers, one of which is an $Al_uGa_vIn_wN$ layer (where u+v+w=1, u≧0, v≧0 and w≧0) 22 that is arranged between the active layer 24 and the substrate 10. The $Al_uGa_vIn_wN$ layer 22 of this preferred embodiment has first conductivity type, which may be n-type, for example. Optionally, an undoped GaN layer could be inserted between the active layer 24 and the $Al_dGa_eN$ layer 26.

In the $Al_dGa_eN$ layer 26, the mole fraction d of Al does not have to be uniform, but could vary either continuously or stepwise, in the thickness direction. In other words, the $Al_dGa_eN$ layer 26 could have a multilayer structure in which a number of layers with mutually different Al mole fractions d are stacked one upon the other, or could have its dopant concentration varied in the thickness direction. To reduce the contact resistance, the uppermost portion of the $Al_dGa_eN$ layer 26 (i.e., the upper surface region of the semiconductor multilayer structure 20) is preferably a layer that has an Al mole fraction d of zero (i.e., a GaN layer).

The electrode 30 is provided on the semiconductor multilayer structure 20. The electrode 30 of the present embodiment includes a Zn layer 32 and an Ag layer 34 formed on the Zn layer 32. The Zn layer 32 and the Ag layer 34 may be at least partially made of an alloy. Specifically, only a boundary part of the Zn layer 32 and the Ag layer 34 may be made of an alloy. Alternatively, the entire electrode 30 may be made of an alloy.

Figure 4:
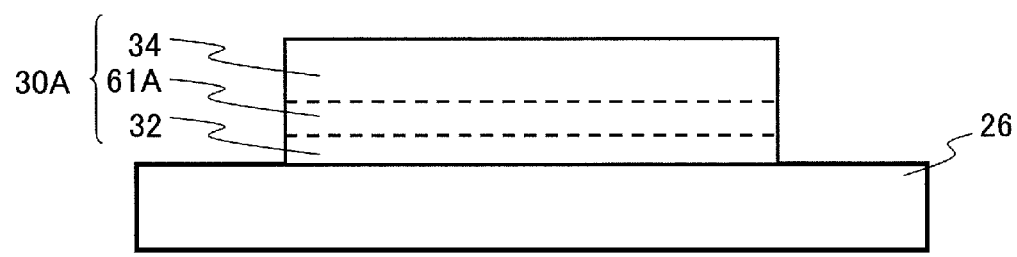
FIGS. 4(a) to 4(c) are diagrams showing the distribution of Zn and Ag in the electrode.
Figure 4:
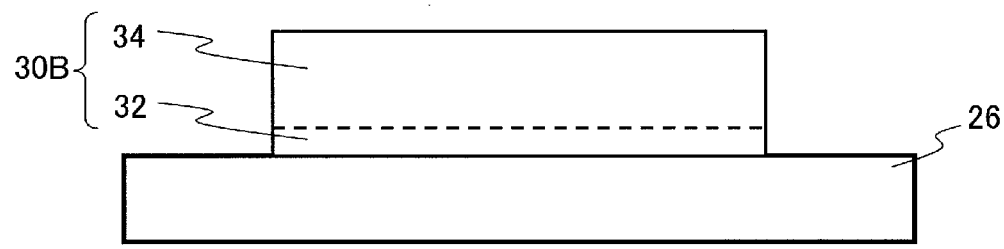
Figure 4:
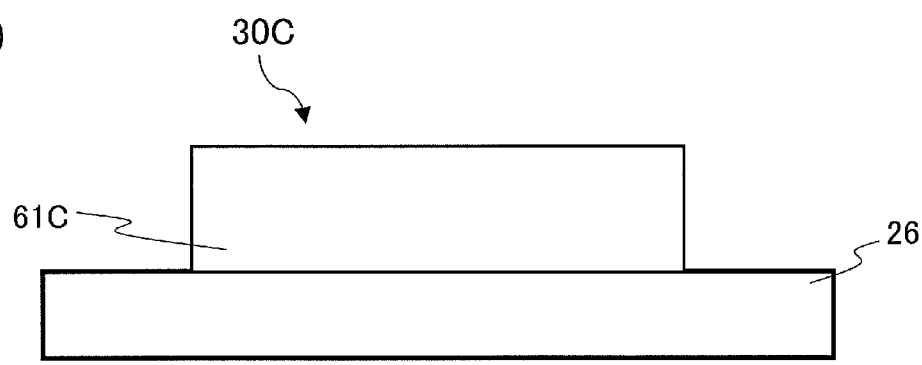

FIGS. 4(a) to 4(c) are diagrams for illustrating the process of alloying the Zn layer 32 and the Ag layer 34. FIG. 4(a) shows a state of the structure in which the Zn layer 32 and the Ag layer 34 have been partially alloyed. In this case, as shown in FIG. 4(a), the electrode 30A includes the Zn layer 32 that is in contact with the $Al_dGa_eN$ layer 26, a Zn—Ag alloy layer 61A lying over the Zn layer 32, and the Ag layer 34 lying over the Zn—Ag alloy layer 61A.

FIG. 4(b) shows a state of the structure in which alloying of Zn and Ag has advanced such that the alloyed portion is in contact with the $Al_dGa_eN$ layer 26. In the state shown in FIG. 4(b), the Zn layer 32 included in the electrode 30B (a portion of the electrode 30B which is in contact with the $Al_dGa_eN$ layer 26) is made of a Zn—Ag alloy.

In the example of the electrode 30B shown in FIG. 4(b), the Ag layer 34 is lying over the Zn layer 32.

FIG. 4(c) shows a state of the electrode 30C in which the Zn layer and the Ag layer have been entirely alloyed. In this state, the electrode 30C is composed only of a Zn—Ag alloy layer 61C.

The Zn—Ag alloys shown in FIGS. 4(a) to 4(c) are made of Zn and Ag (i.e., the major constituents are Zn and Ag). The structures shown in FIGS. 4(a) to 4(c) can be formed by forming the Ag layer 34 on the Zn layer 32 and thereafter performing a heat treatment on these layers. Note that the structure shown in FIG. 4(c) may be formed by performing a vapor deposition using a mixture or compound of Zn and Ag as a source material and thereafter performing a heat treatment on the deposited material.

The Ag layer 34 may be an alloy layer made of Ag as a major constituent and one or more metal additives different from Ag (for example, Cu, Au, Pd, Nd, Sm, Sn, In, Bi) of a very small amount. The Ag layer 34 formed by alloying such metals is superior to Ag in terms of, for example, heat resistance and reliability.

The Ag layer has a high reflectance for light. For example, comparing in terms of the reflectance for blue light, Ag reflects about 97%, Pt reflects about 55%, and Au reflects about 40%.

The Zn layer 32 included in the electrode 30 is in contact with a p-type semiconductor region of the semiconductor multilayer structure 20 and functions as part of the p-electrode. In the present embodiment, the Zn layer 32 is in contact with the $Al_dGa_eN$ layer 26 that is doped with a dopant of the second conductivity type (p-type). The $Al_dGa_eN$ layer 26 may be doped with, for example, Mg as a dopant. Alternatively, the $Al_dGa_eN$ layer 26 may be doped with any other p-type dopant than Mg, for example, Zn or Be.

Note that at least part of the Zn layer 32 may undergo aggregation to form islands over the surface of the $Al_dGa_eN$ layer 26 due to the heat treatment performed after the formation of the layer, so that the islands are separated from one another with spaces. In this case, Ag atoms that constitute the Ag layer 34 intervene between the respective Zn islands. At least part of the Ag layer 34 may undergo aggregation to form islands.

In the present embodiment, the thickness of the electrode 30 is for example from 10 nm to 200 nm. In the electrode 30, the thickness of the Zn layer 32 is smaller than that of the Ag layer 34. The preferred thickness of the Zn layer 32 is, for example, from 0.5 nm to 10 nm. Note that "the thickness of the Zn layer 32" herein refers to the thickness of the Zn layer after the heat treatment.

If the thickness of the Zn layer 32 is 10 nm or less, light radiated from the active layer 24 of the semiconductor multilayer structure 20 is scarcely absorbed by the Zn layer 32 to reach the Ag layer 34. Therefore, larger part of the light is reflected by the Ag layer 34. The thickness of the Zn layer 32 is preferably smaller. For example, it is preferably from 1 nm to 2 nm. When the reflection of light by the Ag layer 34 is not expected, the thickness of the Zn layer 32 may not necessarily be 10 nm or less. When the thickness of the Zn layer 32 is 45 nm or greater, the contact resistance is approximately equal to that obtained in the case where a conventional Pd-based electrode is used. Further, a problem of peeling off of the electrode may occur. Thus, the thickness of the Zn layer 32 is preferably 45 nm or less.

The thickness of the Ag layer 34 is, for example, from 10 nm to 200 nm. Since the penetration depth of light (e.g., light at a blue range wavelength) in the Ag layer 34 is about 10 nm, the Ag layer 34 can sufficiently reflects the light so long as the thickness of the Ag layer is not less than the penetration depth, 10 nm. The reason why the thickness of the Zn layer 32 is smaller than that of the Ag layer 34 is to prevent separation of the Zn layer 32 and the $Al_dGa_eN$ layer 26 which would be caused due to disturbed balance of strain between the Zn layer 32 and the Ag layer 34.

Meanwhile, the GaN-based substrate 10, of which the principal surface 12 is an m-plane, may have a thickness of 100 µm to 400 µm, for example. This is because if the wafer has a thickness of at least approximately 100 µm, then there will be no trouble handling such a wafer. It should be noted that as long as the substrate 10 of this preferred embodiment has an m-plane principal surface 12 made of a GaN-based material, the substrate 10 could have a multilayer structure. That is to say, the GaN-based substrate 10 of this preferred embodiment could also refer to a substrate, at least the principal surface 12 of which is an m-plane. That is why the entire substrate could be made of a GaN-based material. Or the substrate may also be made of the GaN-based material and another material in any combination.

In the structure of this preferred embodiment, an electrode 40 has been formed as an n-side electrode on a portion of an n-type $Al_uGa_vIn_wN$ layer 22 (with a thickness of 0.2 µm to 2 µm, for example) which is located on the substrate 10. In the example illustrated in FIG. 3(a), in the region of the semiconductor multilayer structure 20 where the electrode 40 is arranged, a recess 42 has been cut so as to expose a portion of the n-type $Al_uGa_vIn_wN$ layer 22. And the electrode 40 has been formed on the exposed surface of the n-type $Al_uGa_vIn_wN$ layer 22 at the bottom of the recess 42. The electrode 40 may have a multilayer structure consisting of Ti, Al and Ti layers and may have a thickness of 100 nm to 200 nm, for example.

In this preferred embodiment, the active layer 24 has a GaInN/GaN multi-quantum well (MQW) structure (with a thickness of 81 nm, for example) in which $Ga_{0.9}In_{0.1}N$ well layers (each having a thickness of 9 nm, for example) and GaN barrier layers (each having a thickness of 9 nm, for example) are alternately stacked one upon the other.

On the active layer 24, stacked is the p-type $Al_dGa_eN$ layer 26, which may have a thickness of 0.2 µm to 2 µm. Optionally, an undoped GaN layer could be inserted between the active layer 24 and the $Al_dGa_eN$ layer 26 as described above.

In addition, a GaN layer of the second conductivity type (which may be p-type, for example) could be formed on the $Al_dGa_eN$ layer 26. Furthermore, a contact layer of $p^+$-GaN and the Zn layer 32 could be stacked in this order on that GaN layer. In that case, the GaN contact layer could also be regarded as forming part of the $Al_dGa_eN$ layer 26, not a layer that has been stacked separately from the $Al_dGa_eN$ layer 26.

Next, the feature and specificity of the present embodiment are described in more detail with reference to FIG. 5A to FIG. 6.

Figure 5A:
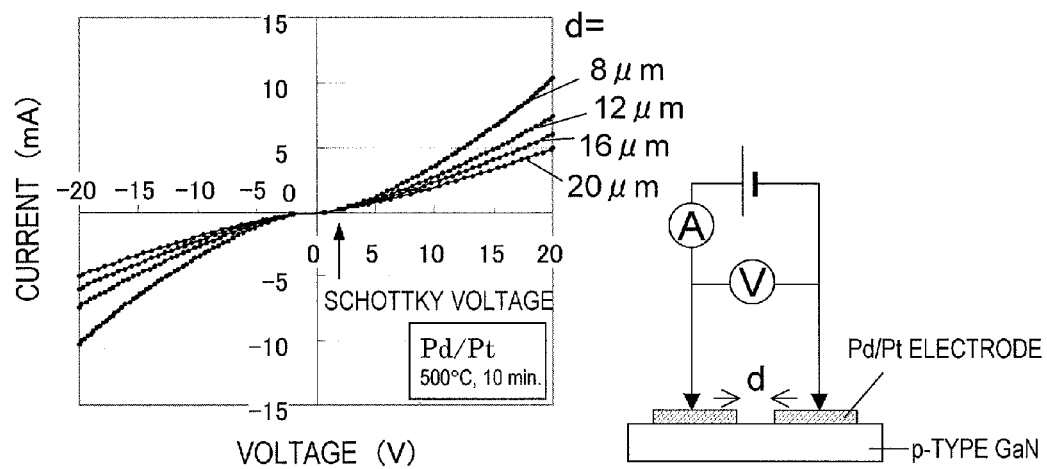
FIG. 5A is a graph showing the current-voltage characteristic under the condition that a heat treatment was performed at an optimum temperature while two Pd/Pt electrodes were in contact with a p-type GaN layer.
Figure 5B:
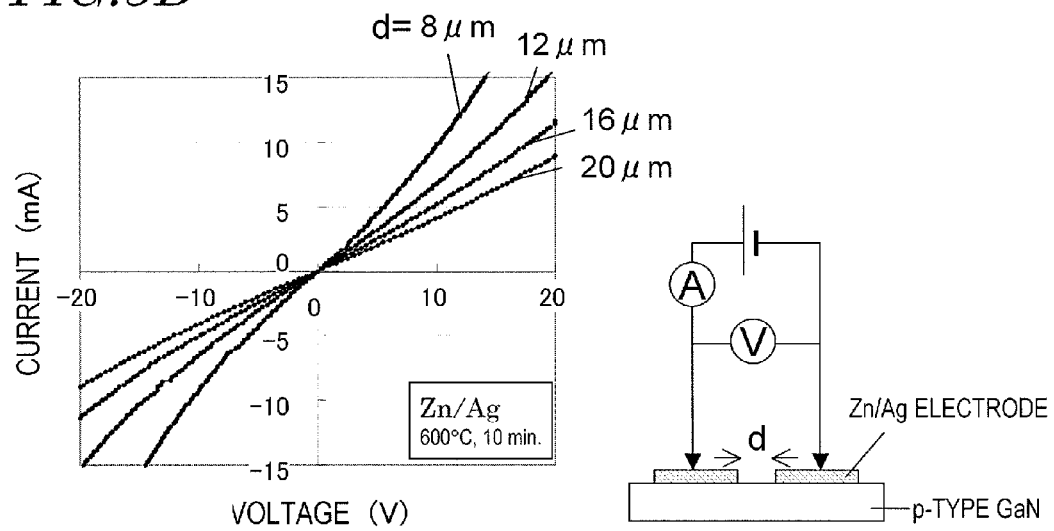
FIG. 5B is a graph showing the current-voltage characteristic under the condition that a heat treatment was performed at an optimum temperature while two Zn/Ag electrodes were in contact with a p-type GaN layer.

FIG. 5A shows the current-voltage characteristic under the condition that two Pd/Pt electrodes are in contact with a p-type GaN layer. FIG. 5B shows the current-voltage characteristic under the condition that two Zn/Ag electrodes are in contact with a p-type GaN layer. The Pd/Pt electrode used herein was an electrode formed by depositing a 40 nm thick Pd layer and a 35 nm thick Pt layer on a p-type m-plane GaN layer and thereafter performing a heat treatment on the resultant structure at 500° C. for 10 minutes in a nitrogen atmosphere (m-plane GaN (Pd/Pt)). The Zn/Ag electrode used herein was an electrode formed by depositing a 7 nm thick Zn layer and a 75 nm thick Ag layer on a p-type m-plane GaN layer and thereafter performing a heat treatment on the resultant structure at 600° C. for 10 minutes in a nitrogen atmosphere (m-plane GaN (Zn/Ag)). In any of the experimental examples disclosed in the present application, the Zn layer and the Ag layer were deposited by a common electron beam evaporation process.

The Zn/Ag electrodes and the Pd/Pt electrodes are in contact with the m-plane GaN layer doped with Mg. In the m-plane GaN layer that is in contact with these electrodes, a region of the layer extending from the layer surface to the depth of 20 nm (uppermost surface region of 20 nm thick) is doped with Mg at $7 \times 10^{19}$ cm$^{-3}$. The remaining part of the m-plane GaN layer, deeper than 20 nm from the layer surface, is doped with Mg at $1 \times 10^{19}$ cm$^{-3}$. If the concentration of the p-type impurity is locally increased in this manner in the uppermost surface region of the GaN layer that is in contact with the p-electrode, the contact resistance can be reduced to the lowest possible level. By performing such an impurity doping, the in-plane non-uniformity of the current-voltage characteristic can also be reduced. As a result, the variation in drive voltage among chips can also be advantageously reduced. That is why in every experimental example disclosed in this application, the surface region of the p-type GaN layer that is in contact with the electrode, extending from the layer surface to the depth of 20 nm, is doped with Mg at $7 \times 10^{19}$ cm$^{-3}$, while the deeper region is doped with Mg at $1 \times 10^{19}$ cm$^{-3}$.

Figure 5C:
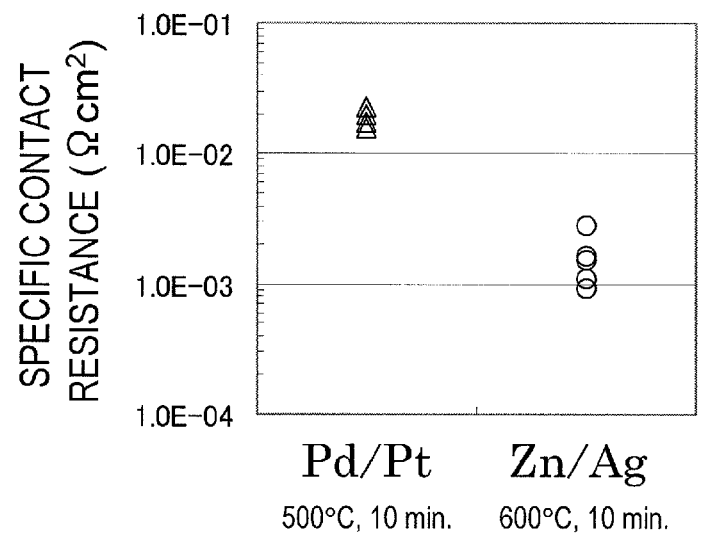
FIG. 5C is a graph which shows the specific contact resistances ($\Omega \cdot cm^2$) of an electrode of Pd/Pt layers and an electrode of Zn/Ag layers, each of which is subjected to a heat treatment at an optimum temperature.
Figure 5D:
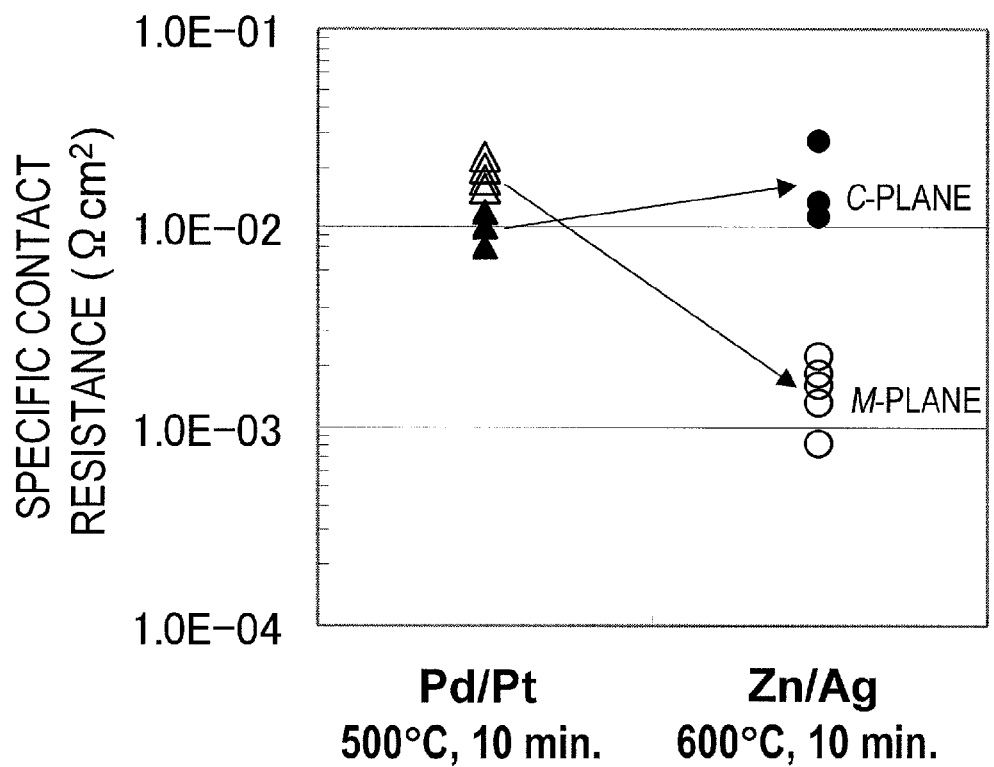
FIG. 5D is a graph illustrating the contact resistance (measured value) of a semiconductor device where a surface of the semiconductor layer which is in contact with the electrode (contact surface) was the m-plane, and the contact resistance (measured value) of a semiconductor device where the contact surface was the c-plane.
Figure 5E:
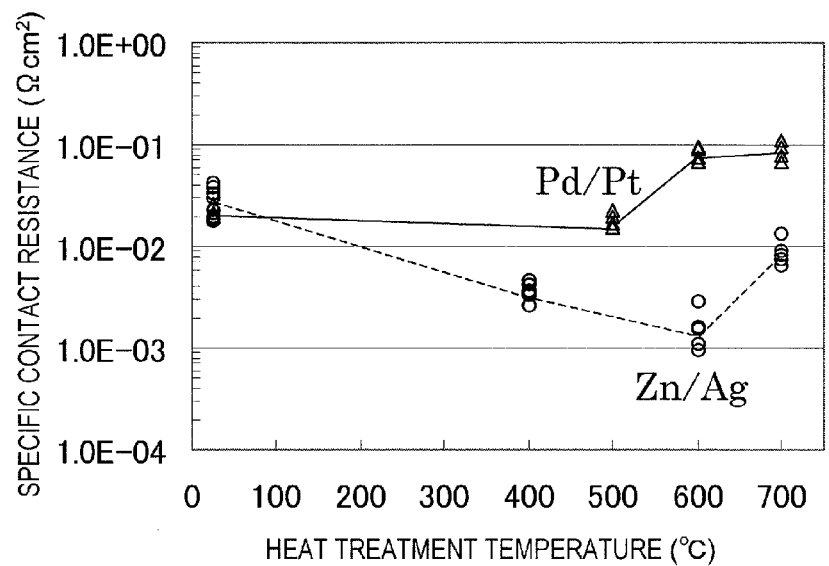
FIG. 5E is a graph which shows the dependence of the specific contact resistances of the electrode of Pd/Pt layers and the electrode of Zn/Ag layers on the heat treatment temperature.
Figure 5F:
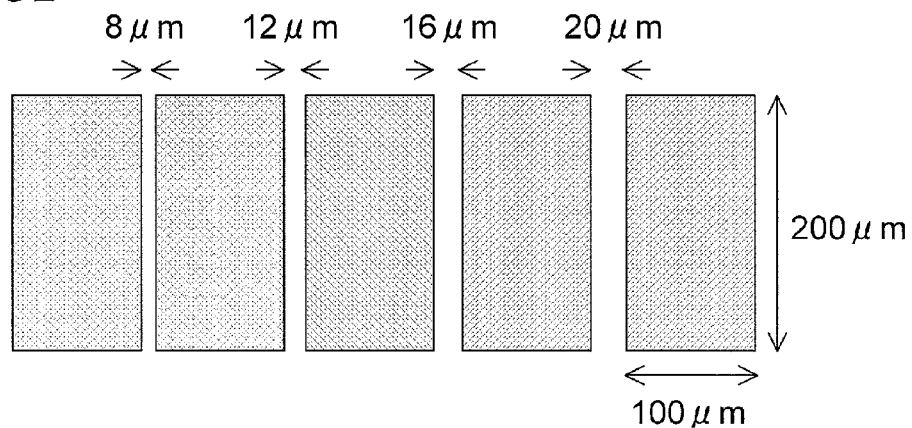
FIG. 5F is a diagram showing a TLM electrode pattern.

The curves of the current-voltage characteristic shown in FIGS. 5A and 5B respectively correspond to the distances between electrodes of the TLM (Transmission Line Method) electrode pattern shown in FIG. 5F. FIG. 5F shows an arrangement of a plurality of electrodes of 100 µm×200 µm with the intervals of 8 µm, 12 µm, 16 µm, and 20 µm.

Pd is a metal of a large work function, which has been conventionally used for the p-electrode. In the Pd/Pt electrode, the Pd layer is in contact with the p-type GaN layer. The graph of FIG. 5A (the current-voltage characteristic of the Pd/Pt electrode) shows a Schottky-type non-ohmic characteristic (Schottky voltage: about 2 V). On the other hand, no Schottky voltage is seen in the graph of FIG. 5B (the current-voltage characteristic of the Zn/Ag electrode). Thus, it can be understood that this Zn/Ag electrode substantially forms an ohmic contact with the p-type GaN layer. Disappearance of the Schottky voltage is critical in decreasing the operating voltages of devices, such as light-emitting diodes, laser diodes, etc.

FIG. 5C is a graph showing the specific contact resistances (Ω·cm$^2$) of the Pd/Pt electrode and the Zn/Ag electrode that have been described above. The Pd/Pt electrode was subjected to a heat treatment at 500° C., and the Zn/Ag electrode was subjected to a heat treatment at 600° C. In the samples that were measured in terms of the specific contact resistance as shown in FIG. 5C, the respective layers had the following thicknesses before the heat treatment. In the Zn/Ag electrode, the Zn layer was 7 nm thick, and the Ag layer was 75 nm thick. In the Pd/Pt electrode, the Pd layer was 40 nm thick, and the Pt layer was 35 nm thick.

The contact resistance was evaluated using the TLM. Referring to the ordinate axis, "1.0E-01" means "$1.0 \times 10^{-1}$", and "1.0E-02" means "$1.0 \times 10^{-2}$" Hence, "1.0E+X" means "$1.0 \times 10^X$".

In general, contact resistance R is inversely proportional to the area of the contact, S (cm$^2$). Where R(Ω) is the contact resistance, the relationship of R=Rc/S holds. The proportionality constant, Rc, is called specific contact resistance, which equals to the contact resistance R when the contact area S is 1 cm$^2$. Thus, the value of the specific contact resistance does not depend on the contact area S and hence serves as an index for evaluation of the contact characteristic. Hereinafter, "specific contact resistance" is sometimes abbreviated as "contact resistance".

As shown in FIG. 5C, the Zn/Ag electrode exhibits a lower specific contact resistance ($\Omega \cdot$cm$^2$) than the Pd/Pt electrode by approximately one order of magnitude.

FIG. 5D is a graph illustrating the contact resistance (measured value) of a semiconductor device where a surface of the semiconductor layer which is in contact with the electrode (contact surface) was the m-plane, and the contact resistance (measured value) of a semiconductor device where the contact surface was the c-plane. In the samples used in this measurement, any of the Zn/Ag electrode and the Pd/Pt electrode was in contact with the p-type GaN layer. In any of the samples, a region of the p-type GaN layer that was in contact with the electrode, extending from the layer surface to the depth of 20 nm, was doped with Mg at $7 \times 10^{19}$ cm$^{-3}$, and the deeper region was doped with Mg at $1 \times 10^{19}$ cm$^{-3}$.

As apparent from FIG. 5D, when the contact surface is the c-plane, the Zn/Ag electrode exhibits a slightly higher contact resistance than the Pd/Pt electrode. However, when the contact surface is the m-plane, the contact resistance of the Zn/Ag electrode is significantly lower than that of the Pd/Pt electrode.

Next, the dependence of the contact resistance on the heat treatment temperature is described. The conventional Pd/Pt electrode and the Zn/Ag electrode of the present embodiment are separately described. FIG. 5E is a graph which shows the dependence of the specific contact resistance values of the Pd/Pt electrode and the Zn/Ag electrode on the heat treatment temperature. In the samples that were measured in terms of the specific contact resistance as shown in FIG. 5E, the respective layers had the following thicknesses before the heat treatment. In the Zn/Ag electrode, the Zn layer was 7 nm thick, and the Ag layer was 75 nm thick. In the Pd/Pt electrode, the Pd layer was 40 nm thick, and the Pt layer was 35 nm thick.

As seen from FIG. 5E, in the case of the m-plane GaN (Pd/Pt) electrode, the contact resistance of the m-plane GaN scarcely changed after the heat treatment at 500° C. At heat treatment temperatures higher than 500° C., an increase of the contact resistance was detected.

On the other hand, in the case of the m-plane GaN (Zn/Ag) electrode, the contact resistance decreased at 400° C. When the heat treatment temperature was 600° C., the contact resistance further decreased. And, at 700° C., the contact resistance was higher than that obtained when the heat treatment temperature was 600° C. but was smaller than the contact resistance obtained in the case of the conventional m-plane GaN (Pd/Pt) electrode.

Therefore, the heat treatment temperature for the m-plane GaN (Zn/Ag) electrode is preferably 400° C. or higher, for example. The upper limit of the heat treatment temperature is preferably 700° C. or less because, if it exceeds 700° C. to reach a predetermined temperature (e.g., 800° C.) or higher, deterioration in the film quality of the electrode and the GaN layer would increase.

Next, photographs of the surfaces of electrodes after the heat treatments at different temperatures are shown in FIG. 6. FIG. 6 shows the photographs of as-deposited electrodes (without heat treatment) and electrodes subjected to heat treatments at 400° C., 500° C., 600° C., and 700° C.

As seen from FIG. 6, in the electrodes where the Pd layer and the Pt layer were provided on the p-type m-plane GaN layer (m-plane GaN (Pd/Pt) electrode), roughened metal surfaces were detected, i.e., degradation of the metal surfaces was recognized, after the heat treatments at 600° C. and 700° C. Note that it was found through the experiments of the present inventor that no roughened metal surface was detected in a Pd/Pt electrode which was formed on a c-plane GaN layer and then subjected to a heat treatment at a temperature from 600° C. to 700° C. In can be appreciated from these results that degradation of an electrode due to the heat treatment is a problem specific to an electrode formed on m-plane GaN.

On the other hand, in the case where the Zn layer and the Ag layer were provided on the p-type m-plane GaN layer (the m-plane GaN (Zn/Ag) electrode of the present embodiment), only small surface irregularities were detected after the heat treatment at 700° C. However, it was confirmed that no significant degradation of the electrodes was detected at any of 400° C., 600° C., and 700° C.

It is understood from the measurement results of the contact resistance shown in FIG. 5E that, in the case of the m-plane GaN (Zn/Ag) electrode, the contact resistance has the lowest value when the heat treatment temperature is around 600° C. On the other hand, it is also understood from the results shown in FIG. 6 that, in the m-plane GaN (Zn/Ag) electrode, the surface degradation is small even when the heat treatment temperature is as high as 700° C., but the state of the surface of the electrode is maintained better as the heat treatment temperature is lower. Degradation of the surface of the Ag layer would lead to a decrease in reflectance, and hence, the surface of the electrode is preferably maintained to have a desirable surface condition. In view of the balance between the contact resistance value and the electrode surface condition, it can be considered that using a heat treatment temperature from 500° C. to 600° C. is especially preferred.

Generally, in fabrication of an excellent p-electrode of a low contact resistance on c-plane GaN, using a metal of a large work function, for example, Pd (work function=5.1 eV) or Pt (work function=5.6 eV), is common knowledge in the art. The work function of Zn (4.3 eV) is smaller than those of other contact electrode materials. The Zn layer is generally recognized as being undesirable for the material of the p-type contact electrode.

For comparison purposes, the present inventor formed a Zn layer as the p-electrode on a p-type c-plane GaN layer and evaluated the contact resistance using a TLM method. The Zn layer, which was the subject of the evaluation, was 200 nm thick as deposited and was subjected to a heat treatment at 500° C. for 10 minutes in a nitrogen atmosphere. As a result, the contact resistance of the Zn layer formed on the c-plane GaN layer was a very high value, about $3.0 \times 10^{-1}$ $\Omega \cdot$m$^2$.

The reason for the decrease of the contact resistance has not been identified but is inferred to be due to specific behaviors of Ga atoms and N atoms in the vicinity of the surface of m-plane GaN as will be described later.

The present inventor used a variety of metals of different work functions, such as Al, Ni, Au, Pd, Pt, etc., as the material of the electrodes for m-plane GaN, and measured the contact resistance of the electrodes. As a result, the present inventor experimentally demonstrated that, even in the case of the m-plane GaN, lower contact resistances are achieved by metals of larger work functions (Pd and Pt). See Japanese Patent Application No. 2009-030147.

The reason why the contact resistance greatly decreases when the electrode structure of the present embodiment (Zn/Ag) is provided on the m-plane GaN is inferred to be that the heat treatment allows only Ga atoms to be diffused toward the electrode side while N atoms are not diffused toward the electrode side. Since only Ga of the GaN is diffused toward the electrode side, the concentration of N is lower than the concentration of Ga in the Zn layer.

When Ga of the p-type GaN is diffused toward the electrode side, the outermost surface of the p-type GaN is lacking Ga atoms, i.e., Ga vacancies are formed. The Ga vacancies have acceptor-like properties, and therefore, as the number of Ga vacancies increases in the vicinity of the interface between the electrode and the p-type GaN, holes more readily pass through the Schottky barrier of this interface by means of tunneling. Thus, it is inferred that the contact resistance decreases when the Zn layer is formed so as to be in contact with the m-plane surface of the p-type GaN layer.

On the other hand, when N atoms as well as Ga atoms are diffused toward the electrode side, the outermost surface of the p-type GaN is lacking N atoms, i.e., N vacancies are also formed. Since the N vacancies have donor-like properties, charge compensation occurs between the Ga vacancies and the N vacancies at the outermost surface of the p-type GaN. It is also inferred that the omission of the N atoms would degrade the crystallinity of GaN crystals. Thus, when N atoms as well as Ga atoms are diffused toward the electrode side, the contact resistance between the p-type GaN layer and the electrode is high.

Figure 7A:
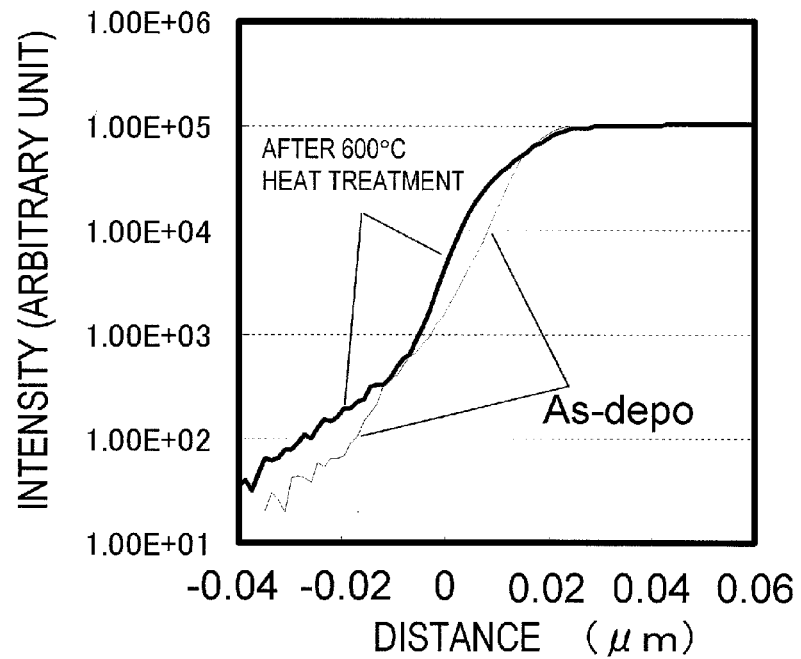
FIG. 7A shows profiles of Ga atoms in the depth direction in the structure wherein the Zn/Ag electrode is provided on the m-plane GaN, which were measured using a SIMS (Secondary Ion-microprobe Mass Spectrometer).

FIG. 7A shows profiles of Ga atoms in the depth direction in the structure wherein the Zn/Ag electrode was provided on the m-plane GaN, which were measured using a SIMS. FIG. 7A shows the profile obtained before the heat treatment (as-depo) and the profile obtained after the heat treatment (after 600° C. heat treatment). The ordinate axis of the graph represents the intensity (corresponding to the Ga concentration), and the abscissa axis represents the distance in the depth direction. The intensity of $1 \times 10^1$ corresponds to the Ga concentration of $1 \times 10^{19}$ cm$^{-3}$. In the abscissa axis, the negative (−) value range is on the electrode side, and the positive (+) value range is on the p-type GaN side. The origin of the abscissa axis (0 μm) is coincident with a peak position of Zn and approximately corresponds to the position of the interface between the p-type GaN layer and the Zn layer.

The heat treatment on the samples used for the measurement was performed at 600° C. for 10 minutes. Before the heat treatment, the thickness of the Zn layer was 7 nm, and the thickness of the Ag layer was 75 nm. In any of the samples, before the heat treatment, a region of the p-type GaN layer that was in contact with the electrode, extending from the layer surface to the depth of 20 nm, was doped with Mg at $7 \times 10^{19}$ cm$^{-3}$, while the deeper region was doped with Mg at $1 \times 10^{19}$ cm$^{-3}$.

As shown in FIG. 7A, in the "as-depo" state, the Ga concentration monotonically decreases as the abscissa value becomes closer to the surface side (negative (−) side). Although not shown in FIG. 7A, the Ga concentration in the "as-depo" state goes beyond the detection limit when the value of the abscissa axis is in the vicinity of −0.05 μm. It is understood from this result that, in the "as-depo" state, Ga was scarcely diffused to the metal side. On the other hand, the Ga concentration after the heat treatment is higher than before the heat treatment in a region from 0.01 μm to 0 μm and in a region from −0.01 μm to −0.04 μm. This result shows that, after the heat treatment, Ga was diffused in the electrode as compared with the state before the heat treatment.

Figure 7B:
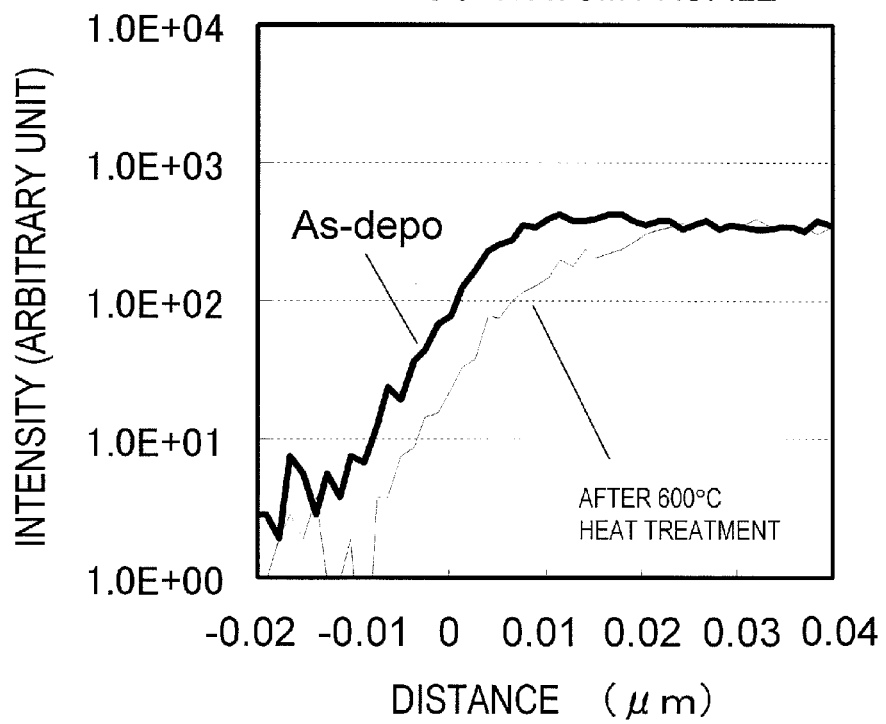
FIG. 7B shows profiles of nitrogen atoms in the depth direction in the structure wherein the Zn/Ag electrode is provided on the m-plane GaN, which were measured using a SIMS.

Next, the behavior of nitrogen is described. FIG. 7B shows profiles of nitrogen atoms in the depth direction in the structure wherein the Zn/Ag electrode was provided on the m-plane GaN, which were measured using a SIMS. The ordinate axis of the graph represents the intensity (corresponding to the N concentration), and the abscissa axis represents the distance in the depth direction. In the ordinate axis, the intensity of $1 \times 10^1$ substantially corresponds to the N concentration of $1 \times 10^{19}$ cm$^{-3}$. In the abscissa axis, the negative (−) value range is on the electrode side, and the positive (+) value range is on the p-type GaN side. The origin of the abscissa axis (0 μm) is coincident with a peak position of Zn and approximately corresponds to the position of the interface between the p-type GaN layer and the Zn layer.

The heat treatment on the samples used for the measurement was performed at 600° C. for 10 minutes. Before the heat treatment, the thickness of the Zn layer was 7 nm, and the thickness of the Ag layer was 75 nm. The structure of the electrode and the doping conditions for the p-type GaN were the same as those of the samples from which the measurement results of FIG. 7A were obtained.

As shown in FIG. 7B, comparing the intensity before the heat treatment (as-depo) and the intensity after the heat treatment (after 600° C. heat treatment) at the same abscissa values (from 0 to −0.02), the nitrogen concentration in the electrode seems lower after the heat treatment than before the heat treatment. However, this is considered to be due to such a measurement error that the positions of the two profiles in the depth direction were deviated when measured. The profile before the heat treatment (as-depo) and the profile after the heat treatment (after 600° C. heat treatment) both have a region in which the nitrogen concentration is constant (p-type GaN side) and a region in which the nitrogen concentration monotonically decreases as the abscissa value becomes closer to the electrode surface side (electrode side) and represent similar behaviors. It is understood from this result that nitrogen was scarcely diffused by the heat treatment.

It is understood from the results shown in FIGS. 7A and 7B that, in the m-plane GaN, only the Ga atoms were diffused to the electrode side, while the nitrogen atoms were not diffused.

It is inferred that the behaviors of respective ones of such elements (Ga, N) occur even when some of Ga atoms are replaced by Al or In atoms in the GaN layer with which the Zn layer is in contact. It is also inferred that the same applies even when the GaN-based semiconductor layer with which the Zn layer is in contact is doped with an element other than Mg as a dopant.

Next, referring again to FIG. 3(a), the structure of the present embodiment is described in more detail.

As shown in FIG. 3(a), the light-emitting device 100 of the present embodiment includes the m-plane GaN substrate 10 and the Al$_u$Ga$_v$In$_w$N layer 22 (where u+v+w=1, u≧0, v≧0, w≧0) provided on the substrate 10. In this example, the m-plane GaN substrate 10 is an n-type GaN substrate (for example, 100 μm thick). The Al$_u$Ga$_v$In$_w$N layer 22 is an n-type GaN layer (for example, 2 μm thick). Provided on the Al$_u$Ga$_v$In$_w$N layer 22 is an active layer 24. In other words, a semiconductor multilayer structure 20 including at least the active layer 24 is provided on the m-plane GaN substrate 10.

In the semiconductor multilayer structure 20, an active layer 24 including an Al$_a$In$_b$Ga$_c$N layer (where a+b+c=1, a≧0, b≧0 and c≧0) has been formed on the Al$_x$Ga$_y$In$_z$N layer 22. The active layer 24 consists of InGaN well layers with an In mole fraction of approximately 25% and GaN barrier layers, both the well layers and the barrier layers may have a thickness of 9 nm each, and the well layers may have a well layer period of three. On the active layer 24, stacked is an Al$_d$Ga$_e$N layer (where d+e=1, d≧0 and e≧0) 26 of the second conductivity type (which may be p-type, for example), which may be an AlGaN layer with an Al mole fraction of 10% and may have a thickness of 0.2 μm. In this preferred embodiment, the Al$_d$Ga$_e$N layer 26 is doped with Mg as a p-type dopant to a level of approximately 10$^{18}$ cm$^{-3}$, for example.

Also, in this example, an undoped GaN layer (not shown) is interposed between the active layer 24 and the $Al_dGa_eN$ layer 26.

Furthermore, in this example, on the $Al_dGa_eN$ layer 26, stacked is a GaN layer (not shown) of the second conductivity type (which may be p-type, for example). In addition, on the contact layer of $p^+$-GaN, stacked in this order are a Zn layer 32 and an Ag layer 34. And this stack of the Zn layer 32 and the Ag layer 34 is used as an electrode (i.e., a p-electrode) 30.

This semiconductor multilayer structure 20 further has a recess 42 that exposes the surface of the $Al_uGa_vIn_wN$ layer 22. And an electrode 40 (n-electrode) has been formed on the $Al_uGa_vIn_wN$ layer 22 at the bottom of the recess 42, which may have a width (or diameter) of 20 μm and a depth of 1 μm, for example. The electrode 40 may have a multilayer structure consisting of Ti, Al and Pt layers, which may have thicknesses of 5 nm, 100 nm and 10 nm, respectively.

The present inventors discovered that the nitride-based semiconductor light-emitting device 100 of this preferred embodiment could have an operating voltage Vop that was approximately 2.0 V lower than that of a conventional m-plane LED with a Pd/Pt electrode, and therefore, could cut down the power dissipation as a result.

Further, it was confirmed that the external quantum yield greatly improves due to the light reflecting effect of the Ag layer 34 as compared with the m-plane LED which includes the conventional Pd/Pt electrode.

Next, a method for fabricating the nitride-based semiconductor light-emitting device 100 of this embodiment is described while still referring to FIG. 3(a).

First of all, an m-plane substrate 10 is prepared. In this preferred embodiment, a GaN substrate is used as the substrate 10. The GaN substrate of this preferred embodiment is obtained by HVPE (hydride vapor phase epitaxy).

For example, a thick GaN film is grown to a thickness of several millimeters on a c-plane sapphire substrate, and then diced perpendicularly to the c-plane (i.e., parallel to the m-plane), thereby obtaining m-plane GaN substrates. However, the GaN substrate does not have to be prepared by this particular method. Alternatively, an ingot of bulk GaN may be made by a liquid phase growth process such as a sodium flux process or a melt-growth method such as an ammonothermal process and then diced parallel to the m-plane.

The substrate 10 does not have to be a GaN substrate but may also be a gallium oxide substrate, an SiC substrate, an Si substrate or a sapphire substrate, for example. To grow an m-plane GaN-based semiconductor on the substrate by epitaxy, the principal surface of the SiC or sapphire substrate is preferably also an m-plane. However, in some instances, a-plane GaN could grow on an r-plane sapphire substrate. That is why according to the growth conditions, the surface on which the crystal growth should take place does not always have to be an m-plane. In any case, at least the surface of the semiconductor multilayer structure 20 should be an m-plane. In this preferred embodiment, crystal layers are formed one after another on the substrate 10 by MOCVD (metalorganic chemical vapor deposition) process.

Next, an $Al_uGa_vIn_wN$ layer 22 is formed on the m-plane GaN substrate 10. As the $Al_uGa_vIn_wN$ layer 22, AlGaN may be deposited to a thickness of 3 μm, for example. A GaN layer may be deposited by supplying $TMG(Ga(CH_3)_3)$, $TMA(Al(CH_3)_3)$ and $NH_3$ gases onto the m-plane GaN substrate 10 at 1,100° C., for example.

Subsequently, an active layer 24 is formed on the $Al_uGa_vIn_wN$ layer 22. In this example, the active layer 24 has a GaInN/GaN multi-quantum well (MQW) structure in which $Ga_{0.9}In_{0.1}N$ well layers and GaN barrier layers, each having a thickness of 9 nm, have been stacked alternately to have an overall thickness of 81 nm. When the $Ga_{0.9}In_{0.1}N$ well layers are formed, the growth temperature is preferably lowered to 800° C. to introduce In.

Thereafter, an undoped GaN layer is deposited to a thickness of 30 nm, for example, on the active layer 24, and then an $Al_dGa_eN$ layer 26 is formed on the undoped GaN layer. As the $Al_dGa_eN$ layer 26, p-$Al_{0.14}Ga_{0.86}N$ is deposited to a thickness of 70 nm by supplying TMG, $NH_3$, TMA, TMI gases and $Cp_2Mg$ (cyclopentadienyl magnesium) gas as a p-type dopant.

Next, a p-GaN contact layer is deposited to a thickness of 0.5 μm, for example, on the $Al_dGa_eN$ layer 26. In forming the p-GaN contact layer, $Cp_2Mg$ is supplied as a p-type dopant.

Thereafter, respective portions of the p-GaN contact layer, the $Al_dGa_eN$ layer 26, the undoped GaN layer, and the active layer 24 are removed by performing a chlorine-based dry etching process, thereby making a recess 42 and exposing a region of the $Al_xGa_yIn_zN$ layer 22 where an n-electrode will be formed. Then, Ti/Al/Pt layers are deposited as an n-electrode 40 on the region reserved for an n-type electrode at the bottom of the recess 42.

Then, a Zn layer 32 is formed on the p-GaN contact layer. On the Zn layer 32, an Ag layer 34 is formed. Thereafter, a heat treatment is performed. In this way, a p-type electrode 30 is formed. Both the Zn layer 32 and the Ag layer 34 can be formed using a common vapor deposition method (a resistance heating method, an electron beam evaporation process, or the like). The Zn layer 32 may be formed by sputtering, a thermal CVD process, or a molecular beam epitaxy (MBE), as well as a vacuum vapor deposition method.

Optionally, the substrate 10 and a portion of the $Al_uGa_vIn_wN$ layer 22 could be removed after that by some technique such as laser lift-off, etching or polishing. In that case, either only the substrate 10 or the substrate 10 and a portion of the $Al_uGa_vIn_wN$ layer 22 could be removed selectively. It is naturally possible to leave the substrate 10 and the $Al_uGa_vIn_wN$ layer 22 as they are without removing them. By performing these process steps, the nitride-based semiconductor light-emitting device 100 of this preferred embodiment is completed.

In the nitride-based semiconductor light-emitting device 100 of this preferred embodiment, when a voltage is applied to between the n- and p-electrodes 40 and 30, holes are injected from the p-electrode 30 into the active layer 24 and electrons are injected from the n-electrode 40 into the active layer 24, thus producing photoluminescence with a wavelength of about 450 nm.

Figure 8:
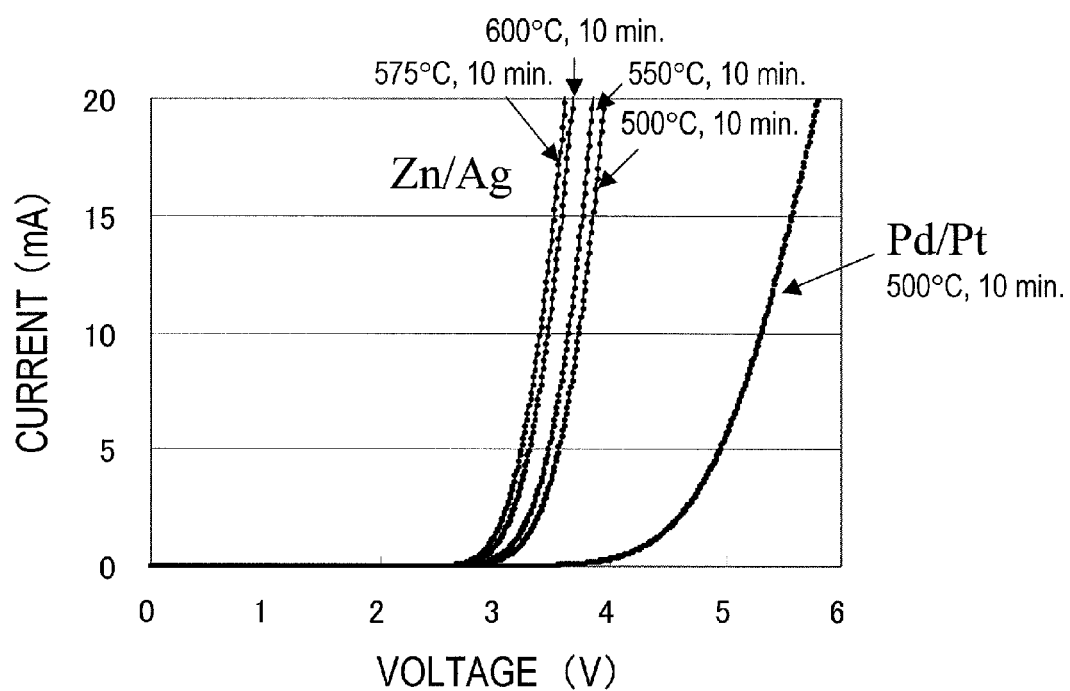
FIG. 8 shows the graphs representing the current-voltage characteristic of light-emitting diodes which include an electrode consisting of Zn/Ag layers and the graph representing the current-voltage characteristic of a light-emitting diode which includes a conventional electrode consisting of Pd/Pt layers.

FIG. 8 shows the current-voltage characteristic of a light-emitting diode which includes an electrode consisting of Zn/Ag layers (samples subjected to heat treatments at 500° C., 550° C., 575° C., and 600° C. for 10 minutes). For comparison purposes, the characteristic of a light-emitting diode which has the same nitride-based semiconductor structure of the light-emitting diode but includes an electrode consisting of Pd/Pt layers is also shown together. In the Zn/Ag electrode before the heat treatment, the thickness of the Zn layer was 7 nm, and the thickness of the Ag layer was 75 nm. In the Pd/Pt electrode before the heat treatment, the thickness of the Pd layer was 40 nm, and the thickness of the Pt layer was 35 nm.

In each of these light-emitting diodes, an n-type GaN layer, an active layer in which three InGaN well layers and two GaN barrier layers are alternately stacked one upon the other, and a p-type GaN layer are stacked in this order on an m-plane GaN substrate. In addition, either a Zn/Ag electrode or a Pd/Pt electrode is provided as a p-electrode on the p-type GaN layer. On the other hand, an n-electrode is formed on the n-type GaN layer by etching the p-type GaN layer and the active layer and exposing the n-type GaN layer.

The threshold voltage of the light-emitting diode which includes the electrode of Pd/Pt layers was about 3.8 V, whereas the threshold voltage of the light-emitting diode which includes the electrode of Zn/Ag layers was about 2.8 V. This means a considerable reduction of the threshold voltage. On the other hand, comparing in terms of the operating voltage for the current value of 20 mA, it is seen that the operating voltage of the light-emitting diode which includes the electrode of Zn/Ag layers is smaller than that of the light-emitting diode which includes the electrode of Pd/Pt layers by 2.0 V or more.

Figure 9:
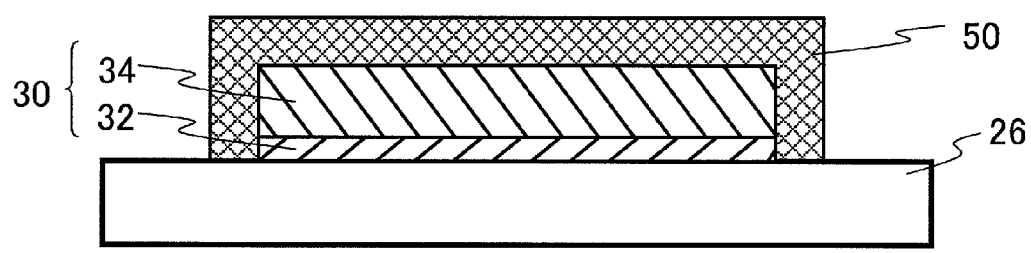
FIG. 9(a) is a cross-sectional view of a nitride-based semiconductor light-emitting device 100 according to an embodiment of the present invention, in which a protector electrode 50 is provided over the surface of an electrode 30.
FIG. 9(b) is a cross-sectional view of the nitride-based semiconductor light-emitting device 100 according to an embodiment of the present invention, in which a protector layer 51 is provided over the electrode 30.
Figure 9:
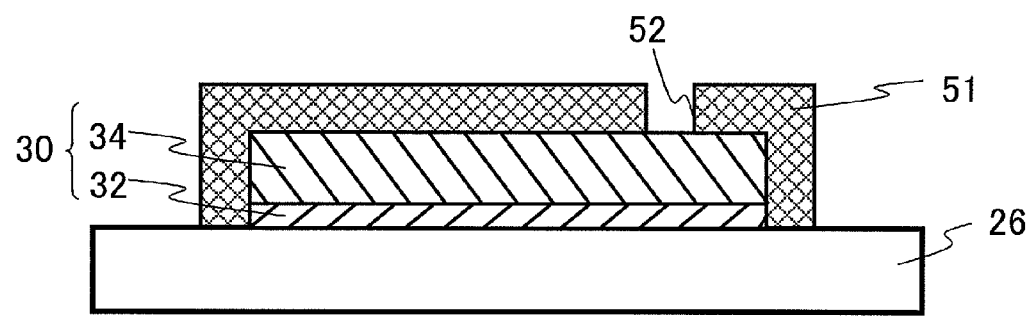

In the present embodiment, as shown in FIG. 9(a), the surface of the electrode 30 consisting of the Zn layer 32 and the Ag layer 34 may be covered with a protector electrode 50 made of a metal other than Ag (for example, Ti, Pt, Mo, Pd, Au, W, or the like). However, the light absorption loss of these metals is larger than that of Ag. Thus, the thickness of the Ag layer 34 is preferably equal to or greater than the penetration depth of light, i.e., 10 nm, so that all part of the light is reflected by the Ag layer 34 so as not to reach the protector electrode 50. In the case where a metal which causes a relatively small light absorption loss is used for the protector electrode 50, the protector electrode 50 also has the effects of a reflection film. Therefore, the thickness of the Ag layer 34 may be less than 10 nm.

The protector electrode 50 may entirely or partially cover the electrode 30. Since the protector electrode 50 is made of a metal, the electrode 30 and a lead wire (not shown) can be conductively coupled together by bonding the lead wire onto the protector electrode 50 even when the protector electrode 50 entirely covers the electrode 30. When the resistance of the metal that constitutes the protector electrode 50 is large, the protector electrode 50 is preferably provided with an opening through which a lead wire can be directly bonded onto the Ag layer 34 of the electrode 30.

Alternatively, as shown in FIG. 9(b), a protector layer 51 made of a dielectric (e.g., $SiO_2$, SiN) may be provided to protect the electrode 30. If the electrode 30 is entirely covered with the protector layer 51, the electrode 30 could not be conductively coupled to an external element. Thus, it is necessary to provide an opening 52 in the protector layer 51 and directly bond a lead wire (not shown) onto the Ag layer 34 of the electrode 30. The dielectric, such as $SiO_2$ or SiN, has a low refractive index. As such, when the protector layer 51 is formed of such a material, the reflectance of the protector layer 51 can be further increased.

By forming the protector electrode 50 shown in FIG. 9(a) or the protector layer 51 shown in FIG. 9(b), Ag that is susceptible to migration can be prevented from being diffused. Further, by protecting the surface of the Ag layer 34, the Ag layer 34 is less likely to come into contact with sulfur or oxygen in the ambient air. Therefore, sulfuration and oxidation of the Ag layer 34 can be prevented. Note that, among the components of the nitride-based semiconductor light-emitting device 100 shown in FIG. 3(a), those other than the $Al_dGa_eN$ layer 26, the Zn layer 32, and the Ag layer 34 are not shown in FIGS. 9(a) and 9(b).

Note that metal wires (Au, AuSn, or the like) for interconnection may be formed on the above-described protector electrode 50 or protector layer 51.

The present embodiment employs Zn as the material of the p-electrode, which is more abundant on the earth than Pd. Zn is more resistant to oxidation than Mg. The Zn layer can advantageously be formed by a commonly-employed vapor deposition method. Also, it was confirmed that the adhesion between the m-plane GaN layer and the Zn layer was excellent.

While the present invention has been described with respect to preferred embodiments thereof, it is to be understood that these are not limitative examples. As a matter of course, various modifications are possible within the scope of the invention.

Even though its structure is essentially different from the preferred embodiment of the present invention, related structures are also disclosed in Patent Documents 1 and 2. However, those Patent Documents 1 and 2 do not mention at all that the crystallographic plane of their gallium nitride-based semiconductor layer is an m-plane but just disclose a technique for forming an electrode on a c-plane gallium nitride-based semiconductor layer. Specifically, Patent Document 1 discloses a structure in which a thin film metal layer is formed on a p-type GaN layer, and thereafter an Ag alloy layer is formed on the metal layer. Disclosed examples of the metal used for the thin film metal layer are only Pt, Co, Ni, and Pd. These are metals of a large work function. Patent Document 1 seems to use these metals based on such a common knowledge in the art that using a metal of a large work function for the p-electrode is preferred. The inventor of the present application confirmed that, in the case of an m-plane GaN p-electrode, as described above, when simply using a metal of a large work function (Pd, Ni, Pt, or the like), the electrode of such a metal and the m-plane GaN do not form an ohmic contact. Patent Document 2 discloses electrode structures composed of Ag, an Ag—Ni alloy, an Ag—Pd alloy, an Ag—Rh alloy, and an Ag—Pt alloy. In the electrode structures of Patent Document 2, an alloy of a metal of a large work function and Ag is formed. This concept is also based on the common knowledge in the art.

The light-emitting device of the present invention described above could be used as it is as a light source. However, if the light-emitting device of the present invention is combined with a resin including a phosphor that produces wavelength conversion, for example, the device of the present invention can be used effectively as a light source with an expanded operating wavelength range (such as a white light source).

Figure 10:
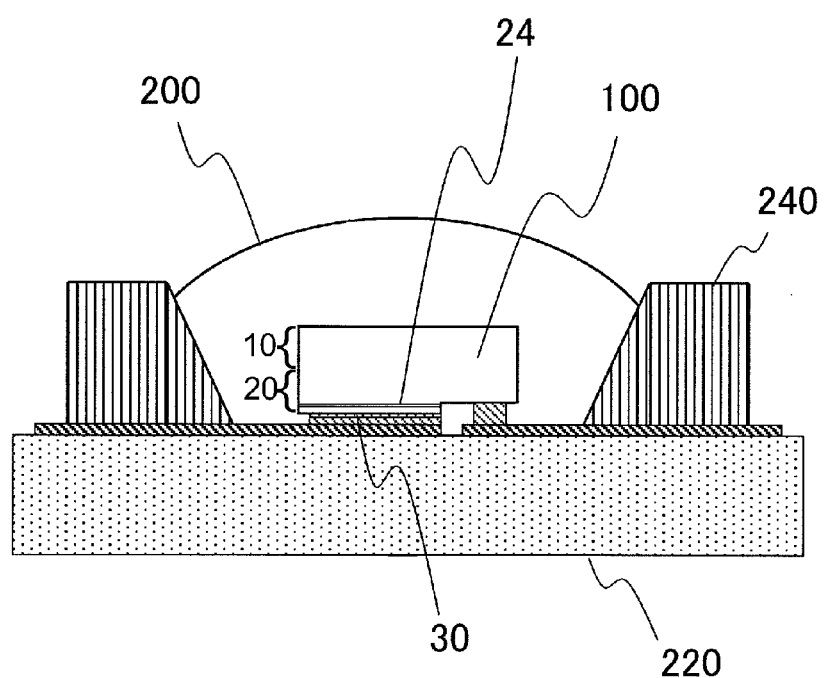
FIG. 10 is a cross-sectional view illustrating a preferred embodiment of a white light source.

FIG. 10 is a schematic representation illustrating an example of such a white light source. The light source shown in FIG. 10 includes a light-emitting device 100 with the structure shown in FIG. 3(a) and a resin layer 200 in which particles of a phosphor such as YAG (Yttrium Aluminum Garnet) are dispersed to change the wavelength of the light radiated from the light-emitting device 100 into a longer one. The light-emitting device 100 is mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

In the light-emitting device 100 shown in FIG. 10, the p-electrode 30, which is a Zn/Ag electrode, is closer to the supporting member 220 than the semiconductor multilayer structure 20 is. Light produced in the active layer 24 of the semiconductor multilayer structure 20 is radially emitted from the active layer 24. Part of the light emitted from the active layer 24 which has passed through a light emission surface 10a and part of the light which has been reflected by the reflective member 240 are transmitted through a resin layer 200 to be emitted outside the light-emitting device 100. In this process, part of the light is converted to light of longer wavelengths by phosphors included in the resin layer 200. On the other hand, another part of the light emitted from the active layer 240 which travels toward the electrode 30 is reflected by the Ag layer of the electrode 30. Since Ag has a high reflectance for light, large part of the light that is incident on the Ag layer is reflected by the Ag layer without being absorbed. The light reflected by the Ag layer propagates through the semiconductor multilayer structure 20 and the resin layer 200 and goes out of the device. As a result, the amount of light emitted from the white light source increases. Thus, in the present embodiment, the external quantum yield can be improved.

Note that the contact structure of the present invention provides the above-described excellent effects when the p-type semiconductor region that is in contact with the Zn layer is formed of a GaN-based semiconductor, specifically an $Al_xIn_yGa_zN$ semiconductor ($x+y+z=1$, $x \geq 0$, $y \geq 0$, $z \geq 0$). As a matter of course, such an effect of reducing the contact resistance can also be obtained in light-emitting devices other than LEDs (e.g., semiconductor lasers) and devices other than the light-emitting devices (e.g., transistors and photodetectors). By using a Zn/Ag electrode, the contact resistance for m-plane GaN can be greatly reduced even when the effect of reflection of light by the Ag layer is not utilized.

Note that the actual m-plane does not always have to be a plane that is exactly parallel to an m-plane but may be slightly tilted from the m-plane by 0±1 degree.

INDUSTRIAL APPLICABILITY

According to the present invention, the contact resistance between the m-plane surface of the p-type semiconductor region and the p-electrode can be reduced, and the light absorption loss in the p-electrode can be reduced. Thus, it can be preferably used for light-emitting diodes (LED).

REFERENCE SIGNS LIST 10 substrate (GaN-based substrate)
10a light emission surface
12 surface of substrate (m-plane)
20 semiconductor multilayer structure
22 $Al_uGa_vIn_wN$ layer
24 active layer
26 $Al_dGa_eN$ layer
30, 30A, 30B, 30C p-electrode
32 Zn layer
34 Ag layer
40 n-electrode
42 recess
50 protector electrode
51 protector layer
52 opening
61A, 61C Zn—Ag alloy layer
100 nitride-based semiconductor light-emitting device
200 resin layer in which wavelength-converting phosphors are dispersed
220 supporting member
240 reflective member

The invention claimed is:

1. A method for fabricating a nitride-based semiconductor device, comprising the steps of:
   (a) providing a substrate;
   (b) forming on the substrate a nitride-based semiconductor multilayer structure including a p-type GaN-based semiconductor region, a surface of the p-type GaN-based semiconductor region being an m-plane; and
   (c) forming an electrode on the surface of the p-type GaN-based semiconductor region of the semiconductor multilayer structure,
   wherein step (c) includes
   forming a Zn layer on the surface of the p-type GaN-based semiconductor region, and
   forming a Ag layer on the Zn layer, and
   performing a heat treatment to anneal the electrode at a temperature of 400° C. to 700° C., and
   wherein a contact resistance of the electrode arranged on the m-plane and annealed at a temperature of 400° C. to 700° C. is less than $1.0 \times 10^{-02}$ $\Omega cm^2$, and is lower than a contact resistance when the electrode is arranged on a c-plane of the same p-type semiconductor region and annealed at a temperature of 400° C. to 700° C.

2. The method of claim 1, wherein the heat treatment is performed at a temperature of 500° C. to 700° C.

3. The method of claim 1, wherein the heat treatment is performed at a temperature of 550° C. to 600° C.

4. The method of claim 1, wherein a Zn—Ag alloy layer is formed between the Zn layer and the Ag layer after the heat treatment.

5. The method of claim 1, wherein the p-type GaN-based semiconductor region is made of an $Al_xIn_yGa_zN$ semiconductor (where $x+y+z=1$, $x \geq 0$, $y \geq 0$, and $z > 0$).

6. The method of claim 5, further comprising removing the substrate after step (b).

7. The method of claim 5, wherein the p-type GaN-based semiconductor region is made of GaN.

8. The method of claim 5 wherein, in the Zn layer, a concentration of N is lower than a concentration of Ga.

9. The method of claim 1, wherein the Ag layer is provided directly on the Zn layer.

* * * * *